(12) United States Patent
Sugimoto et al.

(10) Patent No.: US 7,800,130 B2
(45) Date of Patent: Sep. 21, 2010

(54) SEMICONDUCTOR DEVICES

(75) Inventors: Masahiro Sugimoto, Toyota (JP); Tetsu Kachi, Nisshin (JP); Tsutomu Uesugi, Seto (JP); Hiroyuki Ueda, Kasugai (JP); Narumasa Soejima, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 93 days.

(21) Appl. No.: 11/795,117

(22) PCT Filed: Jan. 20, 2006

(86) PCT No.: PCT/JP2006/301262
§ 371 (c)(1),
(2), (4) Date: Jul. 12, 2007

(87) PCT Pub. No.: WO2006/080413
PCT Pub. Date: Aug. 3, 2006

(65) Prior Publication Data
US 2008/0149964 A1    Jun. 26, 2008

(30) Foreign Application Priority Data
Jan. 28, 2005    (JP) .............................. 2005-022098

(51) Int. Cl.
*H01L 29/778* (2006.01)
(52) U.S. Cl. ................. 257/192; 257/E29.252
(58) Field of Classification Search ................. 257/194
See application file for complete search history.

(56) References Cited

U.S. PATENT DOCUMENTS 5,567,961 A    10/1996 Usagawa et al.
2002/0047113 A1    4/2002 Ohno et al.
2002/0121647 A1*    9/2002 Taylor ........................ 257/192
2003/0218183 A1    11/2003 Micovic et al.
2005/0087763 A1*    4/2005 Kanda et al. ................. 257/192

FOREIGN PATENT DOCUMENTS

EP    0 064 370        11/1982
EP    0 151 309 A2     8/1985

(Continued)

OTHER PUBLICATIONS

Hill, et al., "High Electron Mobility Transistors (HEMTS)—A Review", 645 GEC Journal of Research, vol. 4, No. 1, XP 000021858, pp. 1-14, (Jan. 1, 1986).

*Primary Examiner*—Jarrett J Stark
*Assistant Examiner*—Lawrence Tynes, Jr.
(74) *Attorney, Agent, or Firm*—Finnegan, Henderson, Farabow, Garrett & Dunner, LLP

(57) ABSTRACT

A semiconductor device 10 comprises a heterojunction between a lower semiconductor layer 26 made of p-type gallium nitride and an upper semiconductor layer 28 made of n-type AlGaN, wherein the upper semiconductor layer 28 has a larger band gap than the lower semiconductor layer 26. The semiconductor device 10 further comprises a drain electrode 32 formed on a portion of a top surface of the upper semiconductor layer 28, a source electrode 34 formed on a different portion of the top surface of the upper semiconductor layer 28, and a gate electrode 36 electrically connected to the lower semiconductor layer 26. The semiconductor device 10 can operate as normally-off.

6 Claims, 7 Drawing Sheets

FOREIGN PATENT DOCUMENTS

| | | |
|---|---|---|
| GB | 2 258 344 A | 2/1993 |
| GB | 2 341 722 A | 3/2000 |
| JP | 11-261053 | 9/1999 |
| JP | 2001-358075 | 12/2001 |
| JP | 2003-59946 | 2/2003 |
| JP | 2004-31879 | 1/2004 |

* cited by examiner (a)

(b)

(a)          (b)

(a)          (b)

SEMICONDUCTOR DEVICES

TECHNICAL FIELD

The present invention relates to normally-off type heterojunction semiconductor devices.

BACKGROUND ART

The present application claims priority to Japanese Patent Application 2005-022098 filed on Jan. 28, 2005, the contents of which are hereby incorporated by reference.

There exists a heterojunction semiconductor device being provided with a heterojunction in which a semiconductor layer that has a large band gap is attached to a semiconductor layer that has a small band gap. This type of heterojunction semiconductor device uses a two-dimensional electron gas layer that is developed on a heterojunction interface in order to transfer electrons. The heterojunction semiconductor device can achieve high-speed operation by utilizing the two-dimensional electron gas layer. Among various heterojunction semiconductor devices, the development of a heterojunction semiconductor device that comprises III-V semiconductor layers is especially brisk. Since III-V semiconductors have a large dielectric-breakdown field and a high degree of movement of saturated electrons, III-V semiconductor devices are expected to be able to have high withstand voltage and control large currents. Japanese Laid-Open Patent Application Publication No. 2003-59946, No. 2001-358075, No. 2004-31879, and No. 1999-261053 disclose a heterojunction semiconductor device.

FIG. 13 shows a cross-sectional diagram of a main portion of a heterojunction semiconductor device 200, which is of prior art.

The heterojunction semiconductor device 200 comprises a base plate 222 made of sapphire ($Al_2O_3$), a buffer layer 224 made of aluminum nitride (AlN), a lower semiconductor layer 226 made of gallium nitride (GaN), and an upper semiconductor layer 228 made of aluminum gallium nitride (AlGaN). The upper semiconductor layer 228 contains aluminum. A band gap of the upper semiconductor layer 228 is larger than a band gap of the lower semiconductor layer 226. Thickness of the upper semiconductor layer 228 is represented by T1. Thickness T1 is less than or equal to a few hundred nanometers, which is considerably thinner than the other layers. The upper semiconductor layer 228 supplies electrons to a two-dimensional electron gas layer to be formed between the lower semiconductor layer 226 and the upper semiconductor layer 228. A drain electrode 232, a source electrode 234, and a gate electrode 236 are formed on a top surface of the upper semiconductor layer 228, wherein the gate electrode 236 is disposed between the drain electrode 232 and the source electrode 234. In order to withstand a voltage of more than 1 kV, for example, distance W1 between the gate electrode 236 and the drain electrode 232 is set to be greater than or equal to approximately 5 μm. In order to control leakage current between the gate electrode 236 and the source electrode 234, distance W2 between the gate electrode 236 and the source electrode 234 is set to be greater than or equal to approximately 2 μm. Depending on certain properties desired from the heterojunction semiconductor device 200, distance W1 and distance W2 may be different from the above-mentioned values.

In order to operate the heterojunction semiconductor device 200 as normally-off, a method is known to make the lower semiconductor layer 226 a p-type layer. In a condition where there is no gate-on voltage being applied to the gate electrode 236, if the conductivity type of the lower semiconductor layer 226 is p-type, a energy level of a conduction band of a heterojunction between the lower semiconductor layer 226 and the upper semiconductor layer 228 is above a fermi-level. Therefore, in a condition where there is no gate-on voltage being applied to the gate electrode 236, a two-dimensional electron gas layer is not generated at the heterojunction between the lower semiconductor layer 226 and the upper semiconductor layer 228. In a case where the lower semiconductor layer 226 is p-type, the heterojunction semiconductor device 200 can operate as normally-off.

Further, in order to operate the heterojunction semiconductor device 200 as normally-off, a method is known to make thickness T1 of the upper semiconductor layer 228 significantly thin. Specifically, thickness T1 of the upper semiconductor layer 228 is made to be approximately 10 nm or less. In a condition where there is no gate-on voltage being applied to the gate electrode 236, if thickness T1 of the upper semiconductor layer 228 is thin, a two-dimensional electron gas layer is not generated at the heterojunction between the lower semiconductor layer 226 and the upper semiconductor layer 228. When thickness T1 of the upper semiconductor layer 228 is thin, the heterojunction semiconductor device 200 can operate as normally-off.

In order to operate as normally-off, other methods exist besides the above-mentioned methods. With this type of the heterojunction semiconductor device 200, however, even if other methods are used, the upper semiconductor layer 228 must still be provided to supply electrons to the two-dimensional electron gas layer. In general, thickness T1 of the upper semiconductor layer 228 is made to be nanometers thick. On the other hand, distance W1 between the gate electrode 236 and the drain electrode 232, and distance W2 between the gate electrode 236 and the source electrode 234 are formed to be within a few micrometers to a few hundred micrometers. When a gate-on voltage is applied to the gate electrode 236, a two-dimensional electron gas layer can be generated in an area where the gate electrode 236 is positioned. However, a two-dimensional electron gas layer may not be generated between the gate electrode 236 and the drain electrode 232, and between the gate electrode 236 and the source electrode 234. When this occurs, the two-dimensional electron gas layer does not extend between the drain electrode 232 and the source electrode 234. In this situation, even if a gate-on voltage is applied to the gate electrode 236, the heterojunction semiconductor devise 200 will not turn on.

It is difficult to design a heterojunction semiconductor devise 200 that has large distances of W1 and W2 for obtaining a high withstand voltage and will turn on by applying voltage to the gate electrode 236.

An objective of the present invention is to provide a heterojunction semiconductor device that stably turns on with a gate-on voltage and has a high withstand voltage.

DISCLOSURE OF INVENTION

A semiconductor device of the present invention comprises a lower semiconductor layer comprising a first type of semiconducting material and an upper semiconductor layer comprising a second type of semiconducting material. The upper semiconductor layer is attached to a top surface of the lower semiconductor layer. The second type of semiconducting material has a larger band gap than the first type of semiconducting material. The semiconductor device further comprises a first electrode formed on a portion of a top surface of the upper semiconductor layer, a second electrode formed on a different portion of the top surface of the upper semiconductor layer, and a gate electrode electrically connected to the lower semiconductor layer.

The gate electrode of the present invention is electrically connected to the lower semiconductor layer. As a result, an electric potential of the lower semiconductor layer can vary in accordance with a electric potential of the gate electrode. A gate-on voltage applied to the gate electrode can affect a large proportion of the lower semiconductor layer. Therefore, when the gate-on voltage is applied to the gate electrode, a two-dimensional electron gas layer can be generated to cover an entire heterojunction between the lower semiconductor layer and the upper semiconductor layer. The two-dimensional electron gas layer is generated across a region stretching from an area below the first electrode to an area below the second electrode. According to the present invention, the heterojunction semiconductor device can stably turn on and operate as normally-off.

It is preferable that the first and second types of semiconducting materials comprise III-V semiconductors.

Compared to other semiconducting materials, III-V semiconductors have a large dielectric-breakdown field and a high degree of movement of saturated electrons. Therefore, a semiconductor device that comprises III-V semiconductors can withstand high voltages and control extremely large currents. A semiconductor device that comprises III-V semiconductors can also be used effectively for the present invention.

It is preferable that the first and second types of semiconducting materials include $Al_XGa_YIn_{1-X-Y}N$ ($0 \leq X \leq 1$, $0 \leq Y \leq 1$, $0 \leq (1-X-Y) \leq 1$). Further, it is preferable that the X of the first type of semiconducting material be smaller than the X of the second type of semiconducting material, and/or the (1-X-Y) of the first type of semiconducting material be larger than the (1-X-Y) of the second type of semiconducting material.

A semiconducting material of $Al_XGa_YIn_{1-X-Y}N$ will have a larger band gap if the material contains a large amount of aluminum. On the other hand, the semiconducting material of $Al_XGa_YIn_{1-X-Y}N$ will have a smaller band gap if the material contains a large amount of Indium. Therefore, a width of the band gap of the semiconducting material of $Al_XGa_YIn_{1-X-Y}N$ varies depending on the relative proportion of aluminum and indium. Making use of this phenomenon, a band gap width relationship between the upper semiconductor layer and the lower semiconductor layer can be controlled.

It is preferable that a conductivity type of the lower semiconductor layer be p-type and that a conductivity type of the upper semiconductor layer be n-type.

Using the above-mentioned conductivity type configuration, in a condition where there is no gate-on voltage being applied to the gate electrode, a depletion layer is formed and covers a region that includes the heterojunction between the lower semiconductor layer and the upper semiconductor layer. This depletion layer, in a condition where there is no gate-on voltage being applied to the gate electrode, can move a energy level of a conduction band of the heterojunction between the lower semiconductor layer and the upper semiconductor layer above a fermi-level. A semiconductor device that comprises the above-mentioned conductivity type configuration can operate as normally-off.

It is preferable that a part of the top surface of the lower semiconductor layer is not covered by the upper semiconductor layer, and the gate electrode is formed on that uncovered region.

A horizontal heterojunction semiconductor device comprising the first electrode, the second electrode, and the gate electrode disposed on one surface of the semiconductor device can be obtained.

It is preferable that the gate electrode extends parallel to a direction along which the first electrode and the second electrode are separated.

According to the above-mentioned embodiment, the gate voltage to the gate electrode can uniformly affect the region of the heterojunction between the first electrode and the second electrode. The semiconductor device of this embodiment can be reliably turned on by applying a gate voltage to the gate electrode.

The semiconductor device of the present invention can be turned on stably by a gate voltage and be operated as normally-off.

BEST MODE FOR CARRYING OUT THE INVENTION

Figure 1:
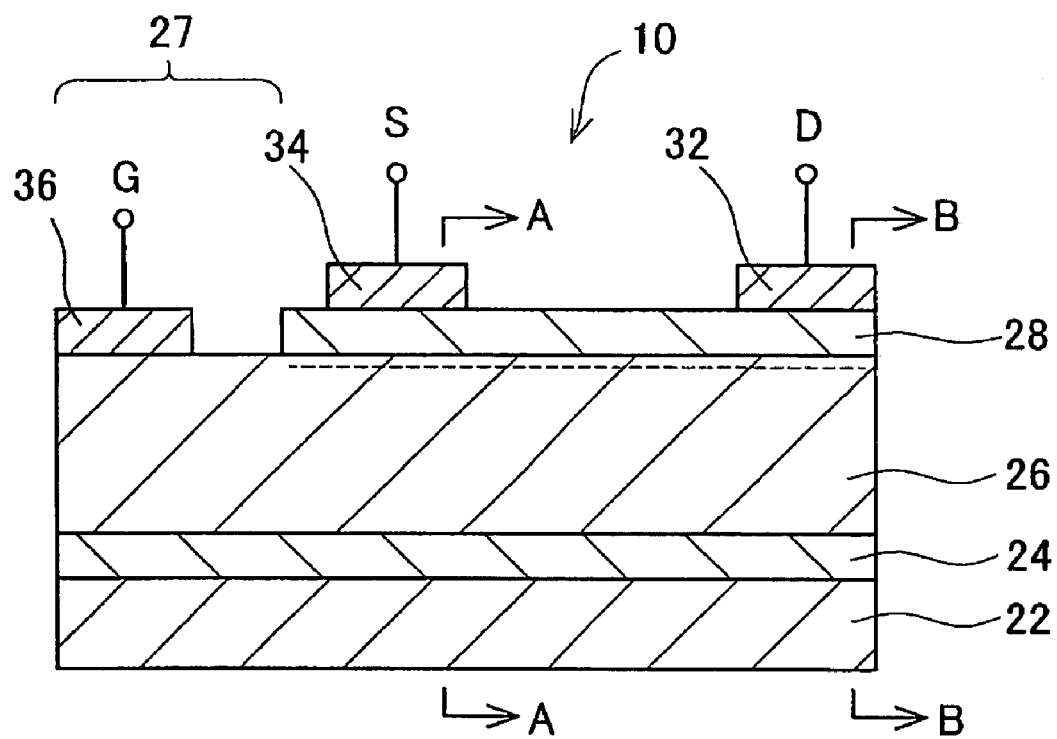
FIG. 1 shows a cross-sectional diagram of a heterojunction semiconductor device of an embodiment according to the present invention.
Figure 2:
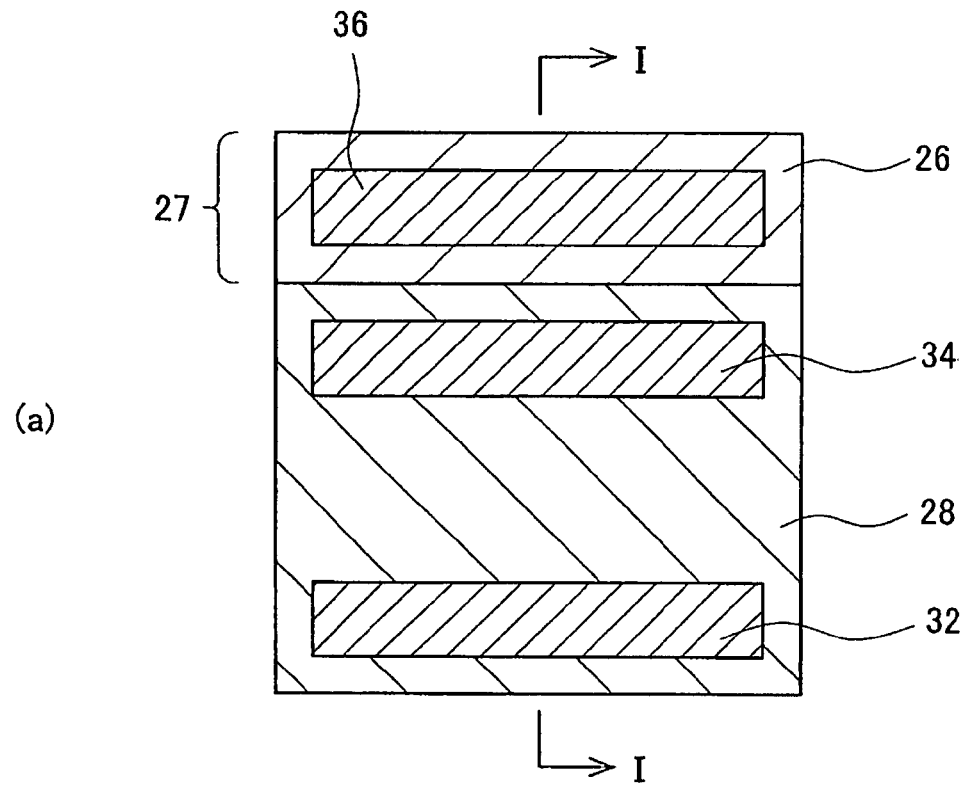
FIG. 2(a) and FIG. 2(b) show a planar diagram of the heterojunction semiconductor device of the embodiment according to the present invention.
Figure 2:
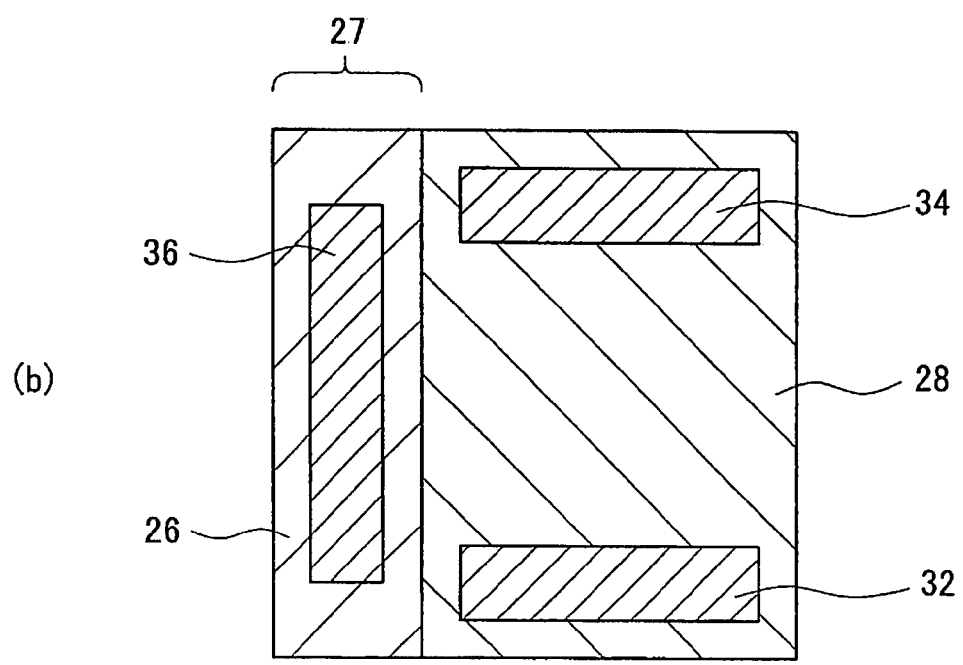

FIG. 1 shows a simplified cross-sectional diagram of a main portion of a semiconductor device 10 comprising a heterojunction. FIG. 2(a) shows a simplified planar diagram of the same portion of the semiconductor device 10. A cross-sectional view along line I-I of FIG. 2(a) corresponds to the cross-sectional diagram of FIG. 1.

The semiconductor device 10 comprises a base plate 22 made of sapphire ($Al_2O_3$). A planar shape of the base plate 22 is a rectangle. A buffer layer 24 made of aluminum nitride (AlN) is formed on a top surface of the base plate 22. A lower semiconductor layer 26 made of p-type gallium nitride (GaN) is formed on a top surface of the buffer layer 24. An upper semiconductor layer 28 made of n-type aluminum gallium nitride (AlGaN) is formed on a portion of a top surface of lower semiconductor layer 26. The upper semiconductor layer 28 is not formed on the entire top surface of the lower semiconductor layer 26. A planar shape of the upper semiconductor layer 28 is a rectangle. The upper semiconductor layer 28 contains aluminum (Al), but lower semiconductor layer 26 does not. Therefore, a band gap of the upper semiconductor layer 28 is larger than a band gap of the lower semiconductor layer 26. Accordingly, the lower semiconductor layer 26 and the upper semiconductor layer 28 form a heterojunction.

As shown in FIG. 2(a), a drain electrode 32 of rectangular shape is formed on a portion of the top surface of the upper semiconductor layer 28. A long direction of the drain electrode 32 extends parallel to one side of the upper semiconductor layer 28. A source electrode 34 of rectangular shape is formed on a different portion of the top surface of the upper semiconductor layer 28. A long direction of the source electrode 34 extends parallel to the other side of the upper semiconductor layer 28. The long direction of the drain electrode 32 is parallel to the long direction of the source electrode 34. The drain electrode 32 and the source electrode 34 are disposed with a predefined distance of separation between them. The drain electrode 32 and the source electrode 34 both have a laminated structure wherein titanium (Ti) and aluminum (Al) are stacked on top of one another. The drain electrode 32 and the source electrode 34 are both in ohmic contact with the top surface of the upper semiconductor layer 28.

An uncovered region 27, a region not covered by upper semiconductor layer 28, is formed on a part of the top surface of the lower semiconductor layer 26. A gate electrode 36 of rectangular shape is electrically connected to the top surface of the lower semiconductor layer 26 at the uncovered region 27. The gate electrode 36 comprises a laminated structure wherein nickel (Ni) and gold (Au) are stacked on top of one another. The gate electrode 36 is in ohmic contact with the top surface of the lower semiconductor layer 26. A long direction of the gate electrode 36 is formed to be parallel to the long directions of the drain electrode 32 and the source electrode 34.

Next, an operation of the heterojunction semiconductor device 10 will be explained.

The lower semiconductor layer 26 contains impurities of p-type, and the upper semiconductor layer 28 contains impurities of n-type. Accordingly, in a condition where there is no gate-on voltage being applied to gate electrode 36, a depletion layer is formed and covers a region that includes the heterojunction between the lower semiconductor layer 26 and the upper semiconductor layer 28. An energy level of a conduction band of the heterojunction between the lower semiconductor layer 26 and the upper semiconductor layer 28 moves above a fermi level when, for example, 5V is applied to the drain electrode 32, the source electrode 34 is connected to ground, and 0V is applied to the gate electrode 36. Therefore, in a condition where there is no gate-on voltage being applied to the gate electrode 36, which essentially means the semiconductor device 10 is turned off, a two-dimensional electron layer is not generated at the heterojunction between the lower semiconductor layer 26 and the upper semiconductor layer 28. As a result, the semiconductor device 10 can operate as normally-off.

From an off state, the semiconductor device 10 turns on when, for example, a gate-on voltage of −5V is applied to the gate electrode 36. Since the gate electrode 36 is electrically connected to the lower semiconductor layer 26, electric potential of a substantial portion of the lower semiconductor layer 26 falls to approximately −5V. Therefore, the gate-on voltage can uniformly affect the entire heterojunction between the lower semiconductor layer 26 and the upper semiconductor layer 28. Accordingly, a two-dimensional electron gas layer is generated at the entire heterojunction between the lower semiconductor layer 26 and the upper semiconductor layer 28 (refer to the broken lines in FIG. 1). At the heterojunction, the two-dimensional electron gas layer is generated across a region stretching from an area below the drain electrode 32 to the source electrode 34. As a result, electrons supplied from the upper semiconductor layer 28 to the two-dimensional electron gas layer travels horizontally within the two-dimensional electron gas layer, and the electrons can flow between the source electrode 34 and the drain electrode 36. As a result, the semiconductor device 10 can be reliably turned on by applying a gate voltage to gate electrode 36.

Figure 3:
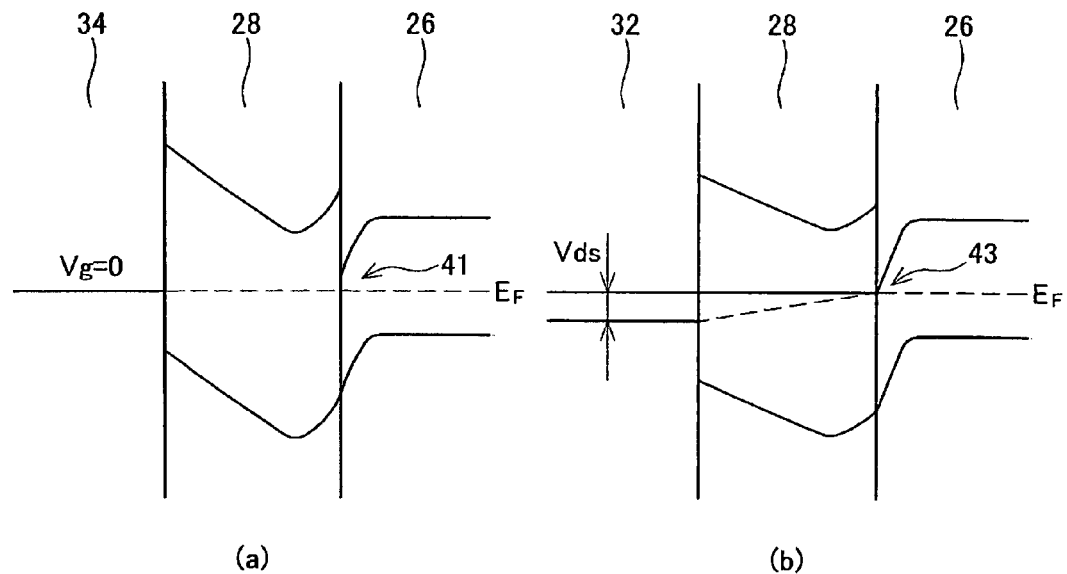
FIG. 3(a) and FIG. 3(b) show an energy band diagram in an off state.
Figure 4:
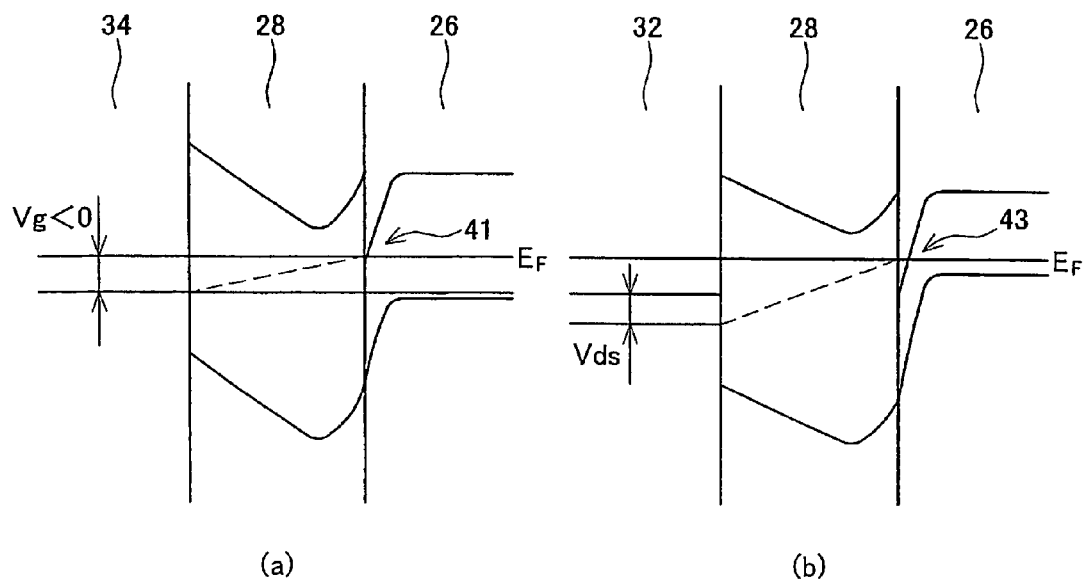
FIG. 4(a) and FIG. 4(b) show an energy band diagram in an on state.

Next, details of the above-mentioned phenomenon will be explained with reference to the energy band diagrams of FIGS. 3 and 4. FIG. 3(a) and FIG. 4(a) are energy band diagrams of the heterojunction between the lower semiconductor layer 26 and the upper semiconductor layer 28, corresponding to line A-A of FIG. 1. In other words, the energy band diagrams shown in FIG. 3(a) and FIG. 4(a) are energy band diagrams of an area below the source electrode 34. FIG. 3(b) and FIG. 4(b) are energy band diagrams of the heterojunction between the lower semiconductor layer 26 and the upper semiconductor layer 28, corresponding to line B-B of FIG. 1. In other words, the energy band diagrams shown in FIG. 3(b) and FIG. 4(b) are energy band diagrams of an area below the drain electrode 32. FIG. 3 is an energy band diagram of when the semiconductor device 10 is turned off. FIG. 4 is an energy band diagram of when the semiconductor device 10 is turned on.

As shown in FIG. 3(a), since the band gap of the upper semiconductor layer 28 is larger than the band gap of the lower semiconductor layer 26, based on that band gap difference, potential well 41 is formed at the lower semiconductor layer 26 close to the heterojunction between the lower semiconductor layer 26 and the upper semiconductor layer 28. An energy level of potential well 41 is above the fermi level ($E_f$) when the semiconductor device 10 is turned off. Therefore, a two-dimensional electron gas layer can not be generated when the semiconductor device 10 is turned off. On the other hand, due to an effect of a drain voltage, there is a possibility that potential well 43 exists below the fermi level at an area of heterojunction below the drain electrode 32. This is shown in FIG. 3(b). However, as shown in FIG. 3(a), since a two-dimensional gas layer is not generated at an area of the heterojunction below the source electrode 34, current cannot flow between the drain electrode 32 and the source electrode 34. In a condition where there is no gate-on voltage being applied to the gate electrode 36, the semiconductor device 10 remains off. The semiconductor device 10 operates as normally-off.

Alternatively, when a gate-on voltage is applied to the gate electrode 36, an electrical potential of a substantial portion of the lower semiconductor layer 26 changes to that gate-on voltage. Accordingly, as shown in FIG. 4(a), when a gate-on voltage is applied to the gate electrode 36, the energy band changes and the potential well 41 exists below the fermi level. Similarly, as shown in FIG. 4(b), when a gate-on voltage is applied to the gate electrode 36, the energy band changes and the potential well 43 exists below the fermi level. In other words, across the entire heterojunction between the lower semiconductor layer 26 and the upper semiconductor layer 28, potential wells 41 and 43 both exist below the fermi level when a gate-on voltage is applied to the gate electrode 36. Accordingly, from the area of the heterojunction below the source electrode 34 to the area of heterojunction below the drain electrode 32, a two-dimensional gas layer is generated along the heterojunction. The semiconductor device 10 utilizes this phenomenon of the two-dimensional gas layer and electrically conducts the source electrode 34 and the drain electrode 32. Using a gate voltage to apply to the gate electrode 36, the semiconductor device 10 can stably switch on and off.

The semiconductor device 10 has other features as described below.

Figure 13:
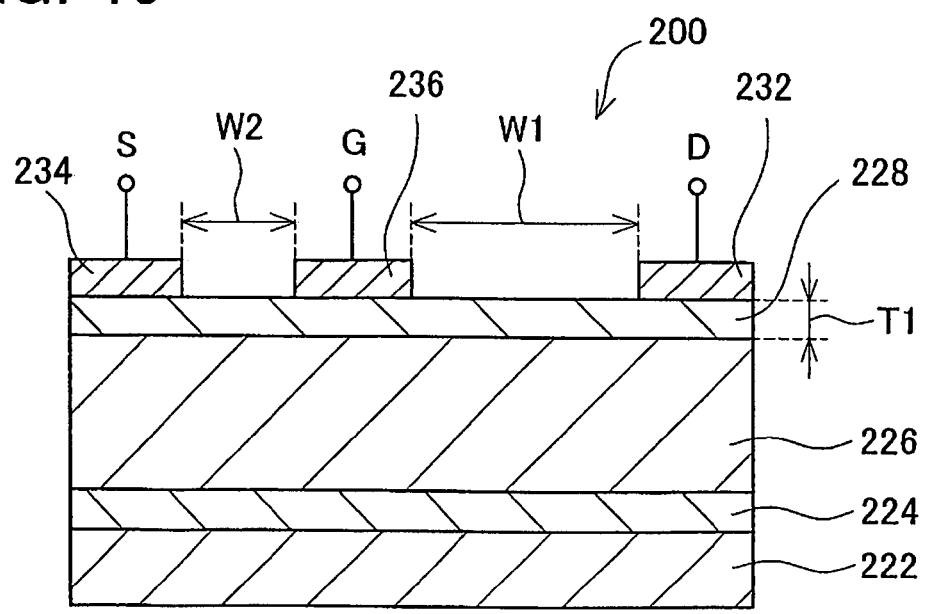
FIG. 13 shows a cross-sectional diagram of a heterojunction semiconductor device of prior art.

If the gate electrode 236 is disposed between the drain electrode 232 and the source electrode 234 as shown in FIG. 13, when the semiconductor device 200 is turned off, current leakage may occur at an area below the gate electrode 236 on a boundary surface between the lower semiconductor layer 226 and the buffer layer 224. The reason for this leakage is that a depletion layer formed beneath the gate electrode 236 on the lower semiconductor layer 226 reaches the buffer layer 224. This phenomenon is caused by a positional relationship between the drain electrode 232, the source electrode 234, and the gate electrode 236. On the other hand, the present embodiment does not have the gate electrode 36 disposed between the drain electrode 32 and the source electrode 34. Therefore, the current leakage phenomenon described above can be avoided with the semiconductor device 10 of the present embodiment.

Further, it is possible to modify the semiconductor device 10 as described below.

The semiconductor device 10 may comprise an SI (semi-insulated) semiconductor layer instead of the upper semiconductor layer 28 of n-type conductivity. The SI semiconductor layer can still function as an electron supplying layer, and the semiconductor device 10 can still stably switch on and off by applying a gate voltage to the gate electrode 36.

In order to achieve a band gap width relationship of "the lower semiconductor layer<the upper semiconductor layer," indium can be added to a lower semiconductor layer instead of adding aluminum to an upper semiconductor layer. By adding indium to the lower semiconductor layer, a band, gap of the lower semiconductor layer can be made smaller. Accordingly, a band gap width relationship of "the lower semiconductor layer<the upper semiconductor layer" can be attained. Alternatively, the band gap width relationship of "the lower semiconductor layer<the upper semiconductor layer" can be attained by making a relative proportion of aluminum in the upper semiconductor layer greater than a relative proportion of aluminum in the lower semiconductor layer. Alternatively, the band gap width relationship of "the lower semiconductor layer<the upper semiconductor layer" can be attained by making a relative proportion of indium in the lower semiconductor layer greater than a relative proportion of indium in the upper semiconductor layer. Alternatively, the band gap width relationship of "the lower semiconductor layer<the upper semiconductor layer" can be attained by adjusting the relative proportions of both aluminum and indium in the upper semiconductor layer and the lower semiconductor layer.

The semiconductor devise 10 may comprise a layout as shown in a planar diagram of FIG. 2(b). In this modification example of the semiconductor device, a long direction of the gate electrode 36 extends parallel to a direction along which the drain electrode 32 and the source 34 are separated (up-down direction of a paper surface). The gate electrode 36 extends from a position next to the drain electrode 32 to a position next to the source electrode 34. According to the semiconductor device of this modification example, a gate-on voltage to be applied to the gate electrode 36 can more uniformly affect a region between the drain electrode 32 and the source electrode 34 at the heterojunction between the lower semiconductor layer 26 and the upper semiconductor layer 28. It is therefore easier to attain a stable turn-on with the semiconductor device of this modification example.

Figure 12:
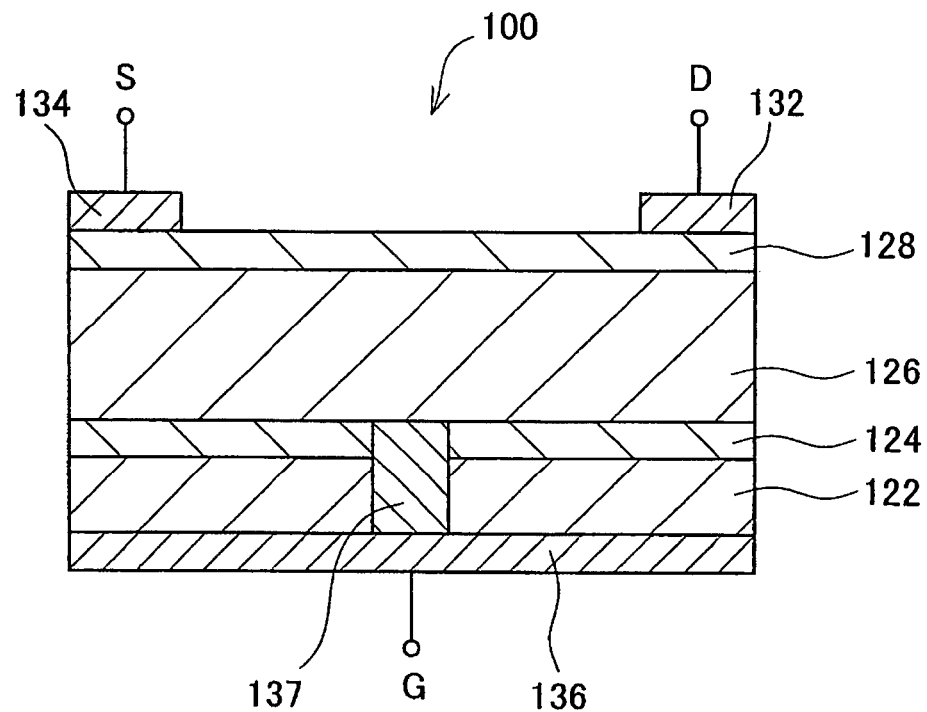
FIG. 12 shows a cross-sectional diagram of a heterojunction semiconductor device of the another embodiment according to the present invention.

In addition, the semiconductor device 100 of a modification example shown in FIG. 12 comprises the gate electrode 136 formed on a bottom surface of the base plate 122 and contact region 137 penetrating base plate 122 and buffer layer 124. The gate electrode 136 can be formed by, for example, a deposition method. The gate electrode 136 and the lower semiconductor layer 126 are electrically connected via the contact region 137. The contact region 137 can be formed by creating a trench on the bottom surface of semiconductor base plate 122, and then filling the trench with, for example, nickel (Ni). Other semiconductor layers or electrodes can be formed with same the materials and configurations as the embodiment described above. The drain electrode 132 is formed on a top surface of the semiconductor device 100, and the gate electrode 36 is formed on a bottom surface of the semiconductor device 100. As a result, the semiconductor device 100 can maintain electrical insulation between the gate electrode 136 and the drain electrode 132.

Next a method of manufacturing the semiconductor device 10 will be explained with reference to FIGS. 5 to 11.

Figure 5:
FIG. 5 shows a process of manufacturing the heterojunction semiconductor device of the embodiment according to the present invention at a stage (1).

First, as shown in FIG. 5, sapphire base plate 22 is prepared. Instead of sapphire base plate 22, other base plates made of different material such as a silicon base plate, silicon carbide base plate, gallium arsenide base plate, and gallium nitride base plate can also be used.

Figure 6:
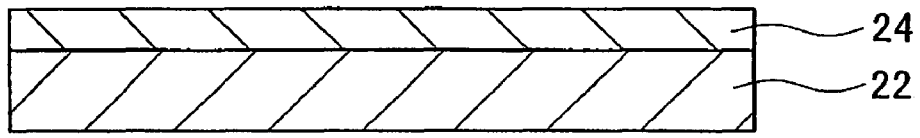
FIG. 6 shows a process of manufacturing the heterojunction semiconductor device of the embodiment according to the present invention at a stage (2).

Next, as shown in FIG. 6, a buffer layer 24 made of aluminum nitride (AlN) is formed at low temperature on the sapphire base plate 22, using a metal organic vapor phase epitaxy method (MOCVD). The buffer layer 24 is approximately 50 nm thick. At this time, tri-methyl aluminum (TMAl) can be used as an aluminum material, and ammonia gas ($NH_3$) can be used as a nitrogen material. Materials that make up the buffer layer 24 may be of the same crystal as the compound crystal formed on the buffer layer 24 in the next step, or of any other crystal with a similar lattice parameter and coefficient of thermal expansion. For example, buffer layer 24 can be gallium nitride (GaN).

Figure 7:
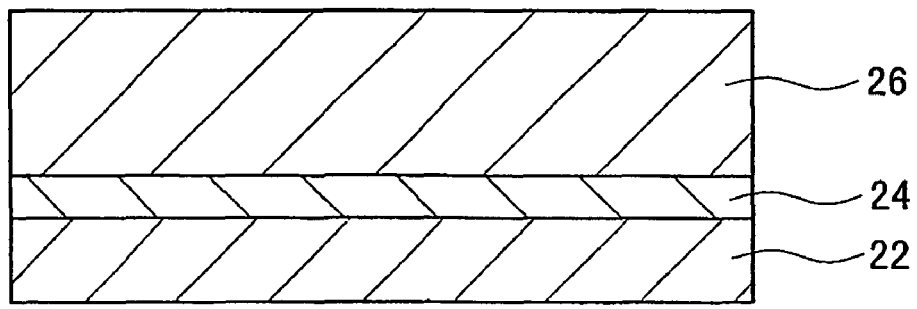
FIG. 7 shows a process of manufacturing the heterojunction semiconductor device of the embodiment according to the present invention at a stage (3).

Next, as shown in FIG. 7, a lower semiconductor layer 26 of p-type gallium nitride (p-GaN) is formed on buffer layer 24 using MOCVD. The lower semiconductor layer 26 is approximately 2 um thick. At this time, tri-methyl gallium (TMGa) can be used as a gallium material, and cyclopentadienyl magnesium (CP2Mg) can be used as dopant material.

Figure 8:
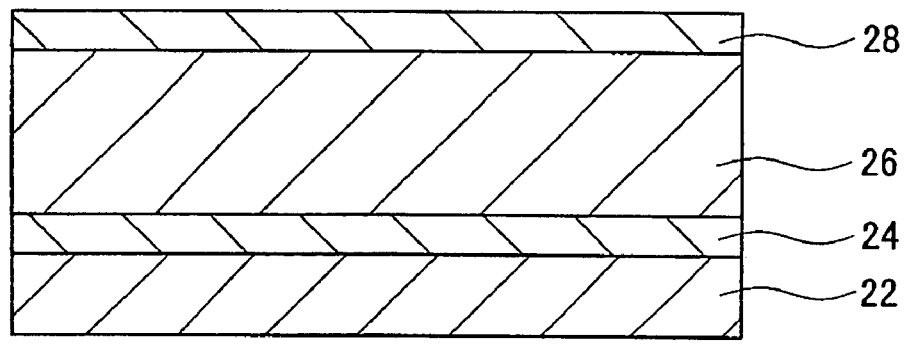
FIG. 8 shows a process of manufacturing the heterojunction semiconductor device of the embodiment according to the present invention at a stage (4).

Next, as shown in FIG. 8, an upper semiconductor layer 28 made of n-type aluminum gallium nitride (n-AlGaN) is formed on the lower semiconductor layer 26 using MOCVD. The upper semiconductor layer 28 is approximately 25 nm thick. At this time, tri-methyl aluminum (TMAl) can be used as an aluminum material, tri-methyl gallium (TMGa) can be used as a gallium material, ammonia gas ($NH_3$) can be used as a nitrogen material, and silane ($SiH_4$) can be used as dopant material.

Figure 9:
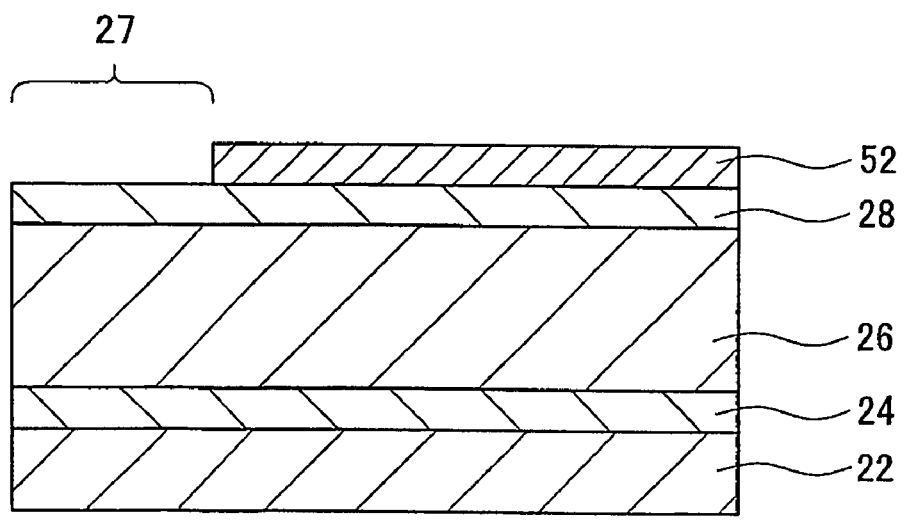
FIG. 9 shows a process of manufacturing the heterojunction semiconductor device of the embodiment according to the present invention at a stage (5).

Next as shown in FIG. 9, mask film 52 is formed on a top surface of the upper semiconductor layer 28 using photolithographic technique, except on a region of the upper semiconductor layer 28 that corresponds to an uncovered region 27 on the lower semiconductor layer 26.

Figure 10:
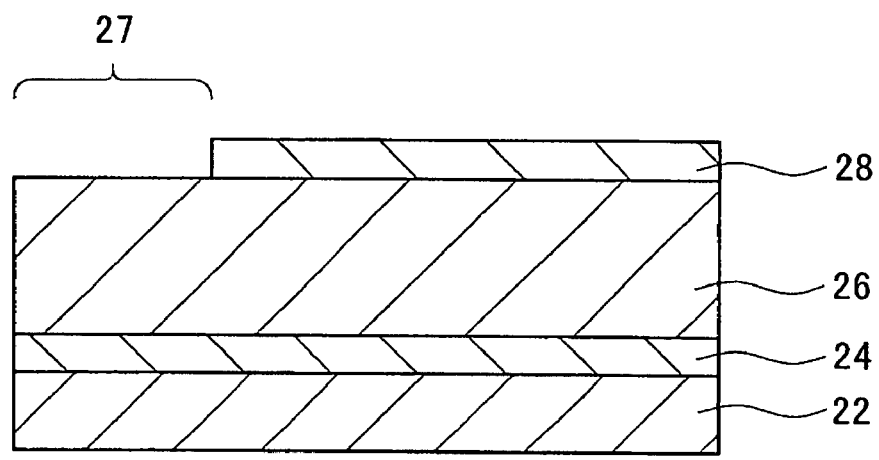
FIG. 10 shows a process of manufacturing the heterojunction semiconductor device of the embodiment according to the present invention at a stage (6).

Next, the area exposed from mask film 52 on the upper semiconductor layer 28 is removed with a dry-etching method using chlorine gas. After the mask film 52 is removed, as shown in FIG. 10, a condition can be attained where the uncovered region 27 on the lower semiconductor layer 26 is exposed.

Figure 11:
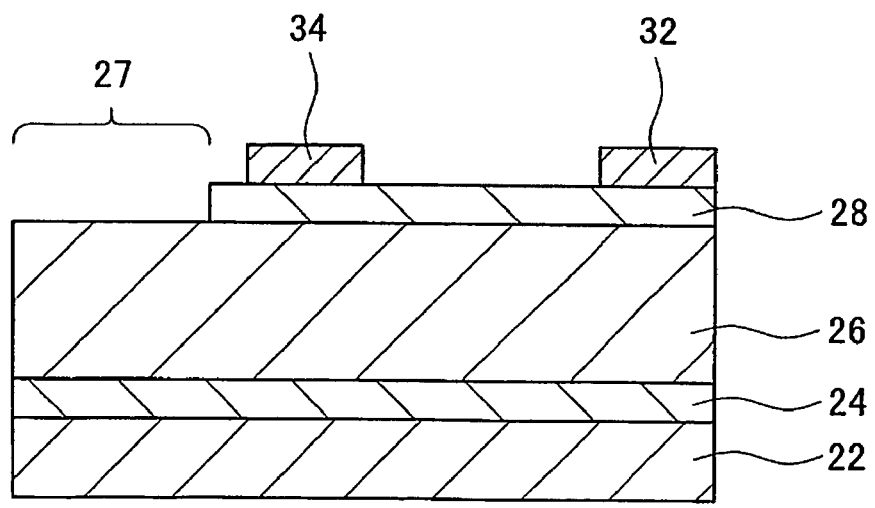
FIG. 11 shows a process of manufacturing the heterojunction semiconductor device of the embodiment according to the present invention at a stage (7).

Next, as shown in FIG. 11, a drain electrode 32 and a source electrode 34 are formed by depositing titanium (Ti) and aluminum (Al) in sequence. The drain electrode 32 and the source electrode 34 are patterned in predetermined positions.

Next, a gate electrode 36 is formed on a top surface of the uncovered region 27 of the lower semiconductor layer 26, using a lift-off method. The lift-off method can be implemented by the following procedure. First, after a register film has been formed, except at an area where the gate electrode 36 is to be formed, Nickel (Ni) an gold (Au) are deposited in sequence. Then, the register film and the nickel (Ni) and gold (Au) formed on the register film are peeled off. In this way, the gate electrode 36 is formed on the area where the register film was not formed. After patterning the drain electrode 32, the source electrode 34, and the gate electrode 36, a heating process is implemented for 30 seconds at 550 degrees Celsius, using a Rapid Thermal Anneal (RTA). Accordingly, contact resistance of the drain electrode 32 and the source electrode 34 against the upper semiconductor layer 28 is reduced, and contact resistance of the gate electrode 36 against the lower semiconductor layer 26 is also reduced. In this way, ohmic contacts can be realized between the drain electrode 32, the source electrode 34 and the upper semiconductor layer 28 and between the gate electrode 36 and the lower semiconductor layer 26.

By completing the steps mentioned above, the heterojunction semiconductor device 10 as shown in FIG. 1 can be attained.

According to the method of manufacturing described above, the heterojunction semiconductor device 10 can be practically attained by using crystal-growth technology, without ion-implanting technology. When ion-implanting technology is used on III-V compound semiconductors, characteristic degradation can often result. However, with the present method of manufacturing, the heterojunction semiconductor device 10 can be attained without using ion-implanting technology. Still, as the need arises, there may be occasions when ion-implanting technology is used.

Specific examples of the present invention have been described above, but these examples are not intended to limit the scope of the claims of the present invention. Within the scope of the claims, various modifications are possible with the embodiments of the present invention described above.

Further, technological components described in the present specification and diagrams are not to be limited by the above-mentioned combinations, for the technological components exhibit technical utility either individually or in various combinations. In addition, the art described in the present specification and diagrams attain multiple objectives simultaneously, and the present invention can be said to have technical utility if it reaches at least one of those objectives.

The invention claimed is:

1. A normally-off heterojunction semiconductor device comprising:
    a lower semiconductor layer comprising a first type of semiconducting material;
    an upper semiconductor layer comprising a second type of semiconducting material that has a larger band gap than the first type of semiconducting material, wherein the upper semiconductor layer is attached to a top surface of the lower semiconductor layer;
    a first electrode formed on a portion of a top surface of the upper semiconductor layer;
    a second electrode formed on a different portion of the top surface of the upper semiconductor layer; and
    a gate electrode electrically connected to the lower semiconductor layer,
    wherein a conductivity type of the lower semiconductor layer is p-type,
    an electric potential of the lower semiconductor layer can vary in accordance with an electric potential of the gate electrode, and
    a two-dimensional electron gas layer is generated at a boundary between the lower semiconductor layer and the upper semiconductor layer when a gate-on voltage is applied to the gate electrode so that the electrons flow between the first electrode and the second electrode via the two-dimensional electron gas layer.

2. The normally-off heterojunction semiconductor device of claim 1, wherein the first and the second types of semiconducting materials include III-V semiconductors.

3. The normally-off heterojunction semiconductor device of claim 2, wherein the first and the second types of semiconducting materials contain $Al_XGa_YIn_{1-X-Y}N$ ($0 \leq X \leq 1$, $0 \leq Y \leq 1$, $0 \leq (1-X-Y) \leq 1$), wherein the X of the first type of semiconducting material is smaller than the X of the second type of semiconducting material, and/or the (1−X−Y) of the first type of semiconducting material is larger than the (1−X−Y) of the second type of semiconducting material.

4. The normally-off heterojunction semiconductor device of claim 1, wherein a conductivity type of the upper semiconductor layer is n-type.

5. The normally-off heterojunction semiconductor device of claim 1, wherein a part of the top surface of the lower semiconductor layer is not covered by the upper semiconductor layer at a portion other than an area extending between the first electrode and the second electrode, and the gate electrode is formed on that uncovered region.

6. The normally-off heterojunction semiconductor device of claim 5, wherein the gate electrode extends parallel to a direction along which the first electrode and the second electrode are separated.

* * * * *